(12) United States Patent
Noda

(10) Patent No.: US 7,565,632 B2
(45) Date of Patent: Jul. 21, 2009

(54) BEHAVIORAL SYNTHESIZER SYSTEM, OPERATION SYNTHESIZING METHOD AND PROGRAM

(75) Inventor: Shinichi Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 242 days.

(21) Appl. No.: 11/615,174

(22) Filed: Dec. 22, 2006

(65) Prior Publication Data

US 2007/0150844 A1     Jun. 28, 2007

(30) Foreign Application Priority Data

Dec. 26, 2005   (JP)   ............................. 2005-372976

(51) Int. Cl.
*G06F 17/50* (2006.01)
(52) U.S. Cl. .................... 716/3; 716/1; 716/2; 716/18; 717/141; 717/142; 717/143; 717/144
(58) Field of Classification Search ................. 716/1–3, 716/18; 717/141–144
See application file for complete search history.

(56) References Cited

U.S. PATENT DOCUMENTS

| | | | | |
|---|---|---|---|---|
| 6,145,120 | A * | 11/2000 | Highland | 717/106 |
| 6,226,776 | B1 * | 5/2001 | Panchul et al. | 716/3 |
| 6,467,075 | B1 * | 10/2002 | Sato et al. | 716/18 |
| 7,302,670 | B2 * | 11/2007 | Bowyer et al. | 716/18 |

FOREIGN PATENT DOCUMENTS

| | | |
|---|---|---|
| JP | 10-326297 A | 12/1998 |
| JP | 11-102381 A | 4/1999 |
| JP | 2001-249955 A | 9/2001 |
| JP | 2001-273347 A | 10/2001 |

OTHER PUBLICATIONS

Luc Séméria, et al., "SpC: Synthesis of Pointers in C. Application of Pointer Analysis to the Behavioral Synthesis from C", Proceedings of the International Conference on computer-Aided Design ICCAD'98, pp. 340-346, San Jose, Dec. 1998.

* cited by examiner

*Primary Examiner*—Naum B Levin
(74) *Attorney, Agent, or Firm*—Sughrue Mion, PLLC

(57) ABSTRACT

A behavioral synthesis system which synthesizes behavior without inline expansion of a callee function, even one which has a pointer as an argument during the synthesis of a caller function. There is also a language analyzer that analyzes the behavior level description for conversion into an internal representation for behavioral synthesis and one which represents a correspondence relationship between a pointer variable and a circuit entity. There is also a pointer-terminal converter that converts a pointer into a set of a terminal and condition in the internal representation generated by the language analyzer. Further, there is a behavioral synthesizer that processes the internal representation from which the pointer variable has been removed by the pointer terminal converter to generate a circuit description at low abstractness.

12 Claims, 17 Drawing Sheets

```
input bool c1;
input char a, b;
output char x, y;

main() {
    if(c1) {
        func(&a, &x);
    } else {
        func(&b, &y);
    }
} void func(input char* i, output char* o) {
    while(*i > 100) {
        *o = *i & 0xF0;
    }
}
```

Fig. 7

```
input c1;
input char a, b;
output char x, y;

main() {
    bool func_start, func_end;
    char func_i, func_o;

if(c1) {
        func_start = 1;
        while(! func_end) {
            func_i = a;
            x = func_o;
        }
    } else {
        func_start = 1;
        while(! func_end) {
            func_i = b;
            y = func_o;
        }
    }
}
```

```
input char func_i;
input bool func_start;
output char func_o;
output bool func_end;

func() {
    while(! func_start) ;
    func_end = 0;

while(func_i > 100) {
        func_o = func_i & 0xF0;
    } func_end = 1;
}
```

Fig. 10

```
register int R[100] /* number_of_port=4 */;
memory   int M[100] /* number_of_port=2 */;

main() {
    func(R, M);
} void func(register int* r /* number_of_port = 3 */, memory int * m) {
    int i;

m[0] = r[0];
    for(i = 1; i < 99; i+=2) {
        m[i]   = r[i-1] + r[i];
        m[i+1] = r[i]   + r[i+1];
    }
}
```

```
struct Port {
    output char address;
    output char write_data;
    outout bool write_enable;
    input  char read_data;
},
struct Memory {  struct Port port[2];  } M;
struct Register { struct Port port[4];  } R;

main() {
    bool func_start, func_end;

struct func_Port {
        char address;
        char write_data;
        bool write_enable;
        char read_data;
    },
    struct Memory {  struct func_Port port[2];  } m;
    struct Register { struct func_Port port[4]; } r;

func_start = 1;
    while(! func_end) {
        int i;

for(i=0; i<2; i++) {
            M.port[i].address      = m.port[i].address;
            M.port[i].write_data   = m.port[i].write_data;
            M.port[i].write_enable = m.port[i].write_enable;
            m.port[i].read_data    = M.port[i].read_data;
        }
        for(i=0; i<3; i++) {
            R.port[i].address      = r.port[i].address;
            R.port[i].write_data   = r.port[i].write_data;
            R.port[i].write_enable = r.port[i].write_enable;
            r.port[i].read_data    = R.port[i].read_data;
        }
    }
}
```

Fig. 11

```
input bool func_start;
output bool func_end;

struct Port {
    output char address;
    output char write_data;
    outout bool write_enable;
    input   char read_data;
},
struct Memory {  struct Port port[2];   } m;
struct Register {  struct Port port[4];  } r;

func() {
    int i;

while(! func_start) ;
    func_end = 0;

r.port[0].address = 0;
    m.port[0].address = 0;
    m.port[0].write_data = r.port[0].read_data;
    m.port[0].write_enable = 1;

for(i = 1; i < 99; i+=2) {
        r.port[0].address = i-1;
        r.port[1].address = i;
        m.port[0].address = i;
        m.port[0].write_data   = r.port[0].read_data + r.port[1].read_data;
        m.port[0].write_enable = 1;

r.port[2].address = i+1;
        m.port[1].address = i+1;
        m.port[1].write_data   = r.port[1].read_data + r.port[2].read_data;
        m.port[1].write_enable = 1;
    } func_end = 1;
}
```

Fig. 12

```
input bool c1;
input char a, b;

register int R[100] /* number_of_port=1 */;
memory   int M[100] /* number_of_port=1 */;

main() {
    if(c1) {
        func(R, &a);
    } else {
        func(M, &b);
    }
} void func(int *ary, input char* i) {
    while(*i < 100) {
        ary[*i] = 10;
    }
}
```

Fig. 13

```
input bool c1;
input char a, b;

struct Port {
    output char address,     output char write_data;
    output bool write_enable;   input   char read_data;
};
struct Memory {   struct Port port[1];   } M;
struct Register {   struct Port port[1];   } R;

main() {
    bool func_start, func_end;

struct func_Port {
        char address;          char write_data;
        bool write_enable;     char read_data;
    };
    struct Array {   struct func_Port port[1];   } ary;

if(c1) {
        func_start = 1;
        while(! func_end) {
            func_i = a;
            R.port[0].address      = ary.port[0].address;
            R.port[0].write_data   = ary.port[0].write_data;
            R.port[0].write_enable = ary.port[0].write_enable;
            ary.port[0].read_data  = R.port[0].read_data;
        }
    } else {
        func_start = 1;
        while(! func_end) {
            func_i = b;
            M.port[0].address      = ary.port[0].address;
            M.port[0].write_data   = ary.port[0].write_data;
            M.port[0].write_enable = ary.port[0].write_enable;
            ary.port[0].read_data  = M.port[0].read_data;
        }
    }
}
```

Fig. 14

```
input char func_i;
input bool func_start;
output bool func_end;

struct Port {
    output char address;
    output char write_data;
    output bool write_enable;
    input   char read_data;
};

struct Array {
    struct Port port[1];
} ary;

func() {
    while(! func_start) ;
    func_end = 0;

while(func_i < 100) {
        ary.port[0].address = i;
        ary.port[0].write_data = 10;
        ary.port[0].write_enable = 1;
    }
        func_end = 1;
}
```

Fig. 15

```
input bool c1;
input char a;
output char x;

main() {
    register R[128];

if(c1) {
        func(R, &a, &x);
    } else {
        x = R[a];
    }
} void func(int *r, input char* i, output char* o) {
    if(*i >= 0) {
        r[*i] = 3;
    } else {
        *o = r[-(*i)];
    }
}
```

Fig. 16

```
input bool c1;
input char a;
output char x;

main() {
    reg R[128];

bool func_start, func_end;

struct func_Port {
        char address;
        char write_data;
        bool write_enable;
        char read_data;
    };

struct Array {
        struct func_Port port[1];
    } r;

if(c1) {
        func_start = 1;
        while(! func_end) {
            if (r.port[0].write_enable) {
                R[r.port[0].address] = r.port[0].write_data;
            } else {
                r.port[0].read_data= R[r.port[0].address];
            }
            func_i = a;
            x = func_o;
        }
    } else {
        x = R[a];
    }
}
```

Fig. 17

```
input char func_i;
input bool func_start;
output char func_o
output bool func_end struct Port {
    output char address,
    output char write_data,
    output bool write_enable,
    input  char read_data,
};

struct Memory or Register {
    struct Port port[1];
} ary;

func() {
    while(! func_start);
    func_end = 0;

if(func_i >= 0) {
        r.port[0].address     = func_i;
        r.port[0].write_data  = 3
        r.port[0].write_enable = 1;
    } else {
        r.port[0].address = -func_i;
        func_o = r.port[0].read_data;
    } func_end = 1;
}
```

Fig. 18

BEHAVIORAL SYNTHESIZER SYSTEM, OPERATION SYNTHESIZING METHOD AND PROGRAM

BACKGROUND OF THE INVENTION (1) Field of the Invention:

The present invention relates to a behavioral synthesis system, behavioral synthesizing method, and program, that is capable synthesizing a circuit description having a low of abstractness from a behavioral-level description.

(2) Description of the Related Art:

In recent years, due to an increase in the size of semiconductor circuits, a variety of approaches have been used for reducing effort and time in designing semiconductor circuits. One such approach proposes the use a behavioral synthesis system for synthesizing a circuit description at low abstractness such as RTL (Register Transfer Level) and the like. The use of such a behavioral synthesis system hardware logic behavior, the configuration of data paths, and the like to be automatically designed from a behavioral-level description which simply hardware logic behavior.

In a behavioral-level description intended to synthesize behavior in such a behavioral synthesis system, when functions are layered such that they are divided into an caller function and a callee function which are connected through a pointer, the pointer must be eliminated in order to synthesize the behavior of the caller function.

Examples of conventional behavioral synthesis systems when a pointer is used in a behavioral-level description are described, for example, in JP-A-2001-27334, and Luc Semeria, Giovanni De Micheli, "SpC: Synthesis of Pointers in C. Application of Pointer Analysis to the Behavioral Synthesis from C," Proceedings of the International Conference on Computer-Aided Design ICCAD'98, pp. 340-346, San Jose, December 1998.

As illustrated in FIG. 1 of JP-A-2001-273347, this conventional behavioral synthesis system comprises language analyzing means (language analyzer), function inline expanding means (function inline expander), pointer analyzing means (pointer analyzer), pointer elimination means (pointer eliminator), and behavioral synthesizing means (behavioral synthesizer).

The conventional behavioral synthesis system having the configuration as mentioned above operates in the following manner. Specifically, functions are inline-expanded after language analysis in order to eliminate pointers used in arguments and the like across functions. Subsequently, pointers are analyzed and eliminated, followed by execution of conventional behavioral synthesis processing (scheduling, binding, RTL description generation processing and the like).

In this conventional behavioral synthesis system, details of a callee function must be determined at a caller function binding stage in order to statically eliminate a pointer. Therefore, this system has a problem that the callee function must be inline-expanded during the behavioral synthesis when layered functions are connected through a pointer in a behavioral-level description.

Then, since a description of the callee function is required upon behavioral synthesis for the caller function in order to inline-expand the callee function, the conventional behavioral synthesis system cannot implement a callee function having a pointer in an argument at a later time or replace implementations. As such, the conventional system fails to provide a design flow which allows the caller function to be completely independent of the implementation of the callee function upon synthesis of the caller function.

Also, when a description of a callee function is inline-expanded within the caller function, an increased number of variables and conditions must be checked when the caller function is debugged, so that the system also suffers from the detrimental effect of a reduction in the efficiency of debugging the circuit after synthesizing behavioral of functions.

Further, since the conventional behavioral synthesis system synthesizes behavioral while a description written within a callee function remains expanded, a longer time may be required due to the need for a wider search space in an analysis on descriptions by a tool, scheduling and the like, possibly resulting synthesizing the behavior of an caller function at a long time.

Furthermore, when the same callee function is called from caller functions at a plurality of locations, the inline expansion can result in the creation of a number of circuit entities equal to the number of times of calls, difficulty in sharing, and a consequent increase in the area of a circuit that is caused by the behavioral synthesis.

In the conventional behavioral synthesis system described above, details of a callee function must be determined at a caller function binding stage in order to statically solve a pointer. Therefore, this system has a problem that the callee function must be inline-expanded during the behavioral synthesis when layered functions are connected through a pointer in a behavioral-level description.

SUMMARY OF THE INVENTION

It is an object of the present invention to provide a behavioral synthesis system, a behavioral synthesizing method, and a recording medium for storing a program, which are capable of synthesizing behavioral without inline-expanding a callee function even if a pointer is passed to the callee function during behavioral synthesis of a caller function.

To achieve the above object, a behavioral synthesis system of the present invention is intended to generate a circuit description at low abstractness from a behavioral-level description. The behavioral synthesis system includes:

language analyzing means for analyzing a behavioral-level description entered thereinto for conversion into an internal representation for behavioral synthesis, and generating an internal a representation indicative of a correspondence relationship between a pointer variable and a specific circuit entity when a pointer variable is converted into a specific circuit entity, based on a pointer type specification within the behavioral-level description;

pointer-terminal converting means for converting a pointer variable in the internal representation generated by the language analyzing means into a set of a terminal and a condition section, based on a predefined conversion rule; and behavioral synthesizing means for performing behavioral synthesis processing for the internal representation from which the pointer variable has been removed by the pointer-terminal converting means to generate and supply a circuit description at low abstractness.

According to the present invention, since the pointer-terminal converting means converts a pointer variable into a set of a terminal such as an input terminal/output terminal and a condition section such as an if-statement to eliminate the pointer variable in an caller function, a callee function need not be inline-expanded during processing to synthesize behavioral of the caller function even if the behavioral synthesis processing is performed for a behavioral description which contains a function that has a pointer variable in an argument.

The behavioral synthesis system may further include pointer type specification analyzing means for analyzing a pointer type specification which is a designation of a pointer variable to a specific circuit entity in the entered behavioral-level description for conversion into an internal representation for behavioral synthesis.

In the present invention, since the pointer type specification analyzing means is provided independently of the language analyzing means, the pointer type specification can be described in a different way from a data type and in a different way from additional information within the behavioral description, thus making it possible to manage information on the pointer type specification separately from the behavioral description.

The behavioral synthesis system may also include pointer type analyzing means for determining a method of converting a pointer variable into a specific circuit entity based on the result of the analysis by the language analyzing means.

In the present invention, with the pointer type analyzing means provided to determine a method of converting a pointer variable into a specific circuit entity, the user is not required to designate a pointer type, and can therefore synthesize the behavior without being conscious of the specific circuit entity which would be mapped to the pointer variable.

Further, the pointer-terminal converting means may not immediately convert a pointer variable into a set of a terminal and a condition section from the result of the analysis by the language analyzing means, but may convert a pointer variable into a set of a terminal and a condition section during processing to during behavioral synthesizing in the behavioral synthesizing means.

According to the present invention, since the pointer variable is not eliminated before ordinary behavioral synthesis processing but is eliminated during ordinary behavioral synthesis processing or after the behavioral synthesis, the behavioral synthesis processing itself can be readily expanded.

As described above, the present invention can advantageously enable behavioral synthesis without inline-expanding a callee function during behavioral synthesis for an caller function, even if layered functions are connected through a pointer in a behavioral-level description which is subjected to behavioral synthesis.

BRIEF DESCRIPTION OF THE DRAWINGS

FIG. 7 is a diagram showing a behavioral-level description in a first example of the present invention;

FIG. 8 is a diagram showing a method of converting a parent (caller) function in the behavioral-level description according to the first example of the present invention;

FIG. 9 is a diagram showing a method of converting a child (callee) function in the behavioral-level description according to the first example of the present invention;

FIG. 10 is a diagram showing a behavioral-level description in a second example of the present invention;

FIG. 11 is a diagram showing a method of converting a parent function in the behavioral-level description according to the second example of the present invention;

FIG. 12 is a diagram showing a method of converting a child function in the behavioral-level description according to the second example of the present invention;

FIG. 13 is a diagram showing a behavioral-level description in a third example of the present invention;

FIG. 14 is a diagram showing a method of converting a parent function in the behavioral-level description according to the third example of the present invention;

FIG. 15 is a diagram showing a method of converting a child function in the behavioral-level description according to the third example of the present invention;

FIG. 16 is a diagram showing a behavioral-level description in a fourth example of the present invention;

FIG. 17 is a diagram showing a method of converting a parent function in the behavioral-level description according to the fourth example of the present invention; and FIG. 18 is a diagram showing a method of converting a child function in the behavioral-level description according to the fourth example of the present invention.

DETAILED DESCRIPTION OF THE PREFERRED EMBODIMENTS

Next, embodiments of the present invention will be described in detail with reference to the drawings.

First Embodiment

Figure 1:
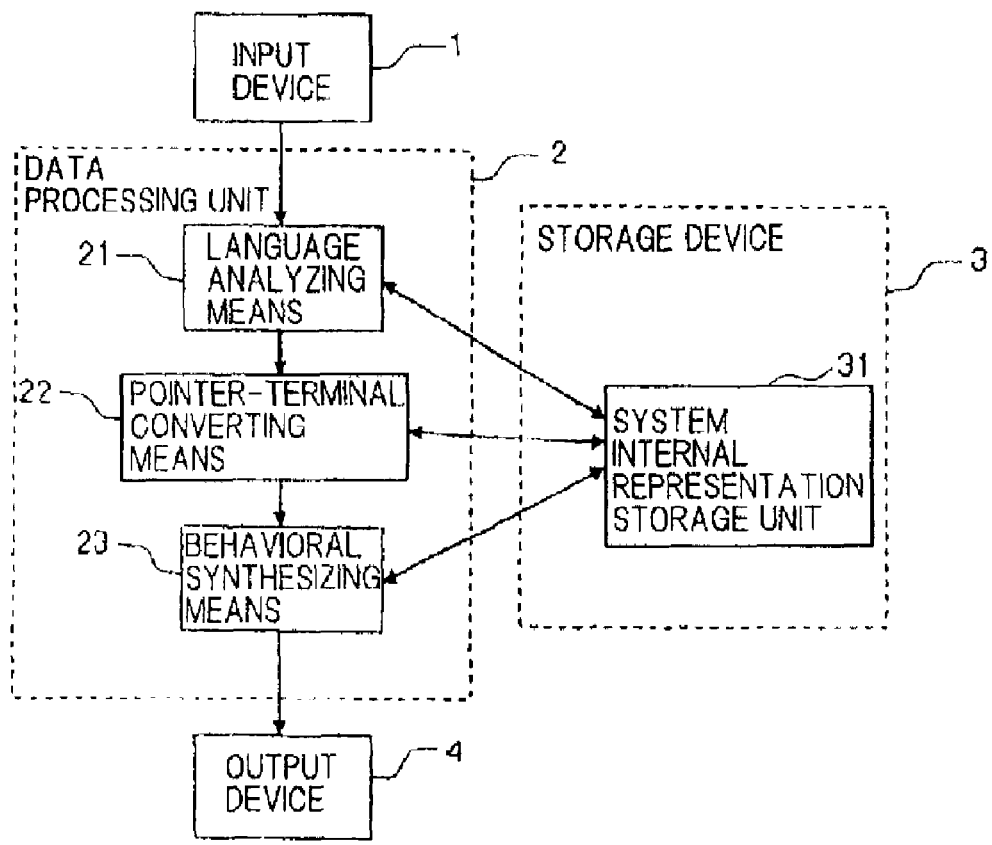
FIG. 1 is a block diagram illustrating the configuration of a behavioral synthesis system according to a first embodiment of the present invention.

FIG. 1 is a block diagram illustrating the configuration of a behavioral synthesis system according to a first embodiment of the present invention. As illustrated in FIG. 1, the behavioral synthesis system of this embodiment comprises data processing unit (central processing unit, processor, or computer) 2 which operates under program control, input device 1, storage device 3, and output device 4.

Data processing unit 2 includes language analyzing means 21, pointer-terminal converting means 22, and behavioral synthesizing means 23. Storage device 3 in turn has system internal representation storage unit 31.

Language analyzing means 21 analyzes a behavioral-level description applied from input device 1 for conversion into an internal representation for behavioral synthesis. Here, the internal representation refers to a representation which is used when the result of an analysis on a behavioral-level description is held within the system. Specifically, the internal representation refers to a representation in which the result of an analysis on a behavioral-level description is preserved in a data structure called an abstract syntax tree (AST) or a control data flow graph (CDFG).

Language analysis means 21 also generates an internal representation indicative of a correspondence relationship between a pointer variable and a specific circuit entity when a pointer variable is converted into a specific circuit entity based on a pointer type specification within a behavioral-level description.

Pointer-terminal converting means 22 converts a pointer variable within an internal representation generated by language analyzing means 21 into a set of a terminal and a condition section based on a predefined conversion rule.

The terminal used herein refers to a primary input terminal/output terminal when a pointer variable is mapped to a specific circuit entity. The primary input terminal/output terminal serves as an interface of a caller function to a callee function. A plurality (required number) of input terminals/output terminals are generated from a single pointer to have appropriate bit widths, respectively, based on the conversion rules. The condition section in turn refers to an if-statement or the like for making a conditional determination.

Behavioral synthesizing means 23 performs normal processing to synthesize behavioral for an internal representation from which pointer variables have been removed by pointer-terminal converting means 22 to generate a circuit description at low abstractness which is then delivered to output device 4.

Exemplary normal behavioral synthesis processing may include the following processing after the generation of CDFG, but such processing does not constitute a feature of the present invention and is therefore omitted from the detailed description.

(1) Optimization in CDFG (including deletion of redundant operation, calculation of constants, and the like).

(2) Scheduling (for determining a cycle for performing each operation).

(3) Binding (for determining which operation and memory unit should be actually used for each operation).

(4) Creation of data path and controller (by generating a data path section and a control section that are separate from each other).

(5) Generation of RTL description.

In this connection, each of language analyzing means 21, pointer-terminal converting means 22, and behavioral synthesizing means 23, writes and reads a system internal representation into and from system internal representation storage unit 31 of storage device 3 as required.

Figure 2:
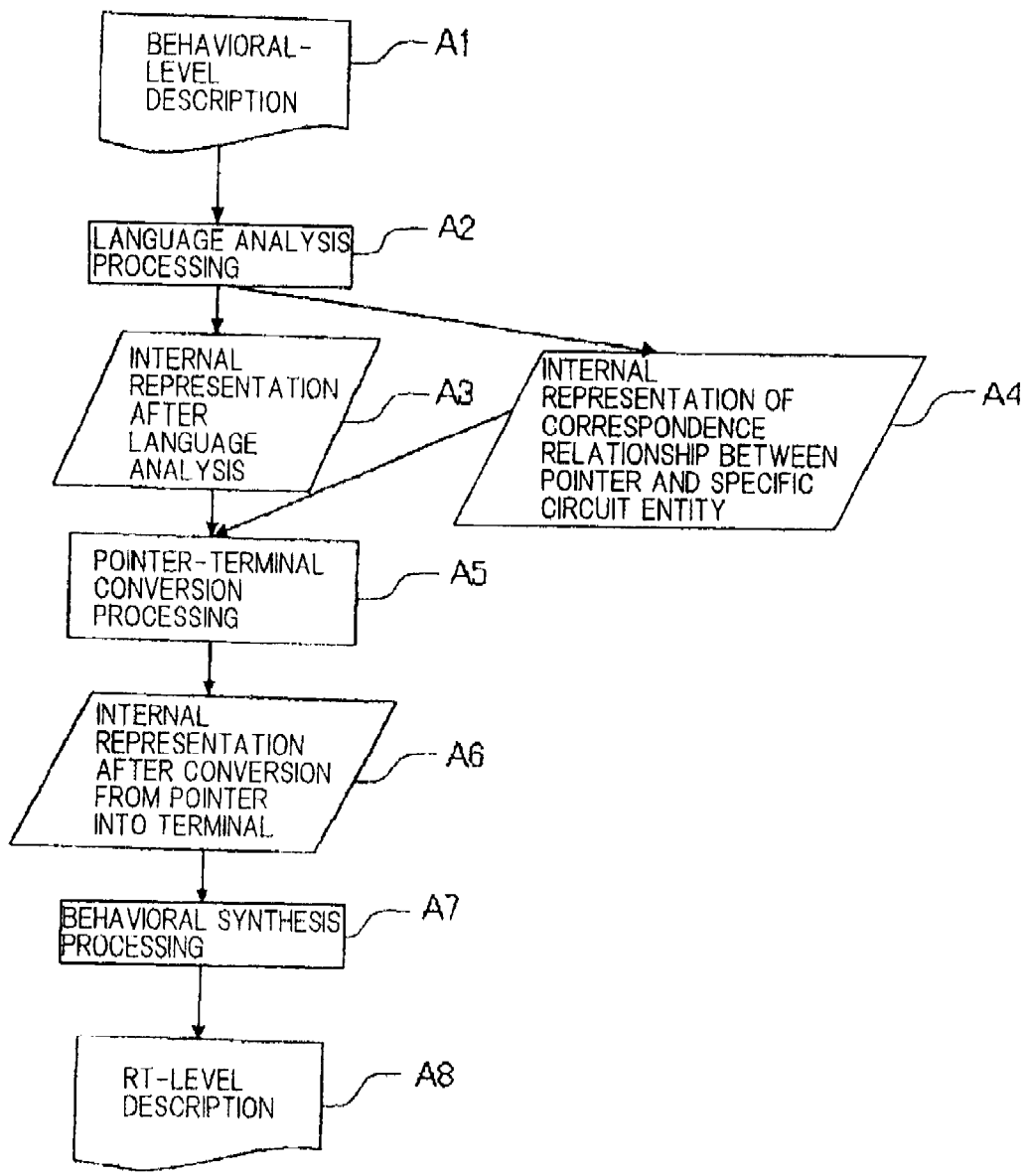
FIG. 2 is a system flow diagram illustrating the behavioral of the behavioral synthesis system according to the first embodiment of the present invention.

Next, the general behavioral of the behavioral synthesis system according to this embodiment will be described in detail with reference to a system flow diagram of FIG. 2.

First, a user provides a behavioral-level description which describes highly abstract circuit specifications in C language or the like (step A1). Assume that this behavioral description includes a description for passing an argument to a callee function through a pointer. Also, the behavioral description includes a data type defined by the language or by additional information that defines to which specific circuit entity (register, memory, primary input terminal or the like) a pointer variable in each function argument is mapped in the behavioral description.

Next, language analyzing means 21 linguistically analyzes the behavioral-level description (step A2) for conversion into an internal representation for behavioral synthesis (step A3). In parallel with these steps, language analyzing means 21 generates an internal representation indicative of a correspondence relationship between a pointer variable and a specific circuit entity when a pointer variable is converted into a specific circuit entity based on a pointer type specification (specification of a specific circuit entity) described at step A1 (step A4).

Since the internal representations generated at steps A3 and A4 are based on to determining to which specific circuit entity a pointer in a function argument is mapped, pointer-terminal converting means 22 performs pointer-terminal conversion processing based on the conversion rule for each specific circuit entity (step A5) to convert the pointer into a set of a required terminal and a condition section (step A6).

Finally, behavioral synthesizing means 23 performs ordinary behavioral synthesis processing (step A7) to generate an RTL description (step A8).

Since the behavioral synthesis system of this embodiment is configured to convert a pointer into a set of a terminal and a condition section based on the pointer type specification as pre-processing of existing ordinary behavioral synthesis processing, even a behavioral description which contains a function that has a pointer in an argument can be synthesized as it is in the form of a black box without inline-expanding a callee function.

Stated another way, a pointer is converted into a set of a terminal and a condition section, and behaves as to an internal representation as if behavioral description had been so written. In this way, the processing subsequent to optimization on CDFG can be performed in a manner similar to a function which does not use a pointer as an argument, thus making it possible to use a majority of existing behavioral synthesis processing as is.

Then, since a caller function can be synthesized so as not to depend on the implementation of a callee function, it is possible to implement a callee function which has a pointer in an argument and to replace implementations.

Also, since a portion having a specific function is separated as a callee function, a reduced number of variables and conditions can be checked when an caller function is debugged, thus improving circuit debugging efficiency after the behavioral synthesis.

Further, since a description written within a callee function need not be taken into consideration during behavioral synthesis, searches may be narrower space in the analysis of the description, scheduling and the like, thus increasing the speed of the behavioral synthesis.

In addition, when the same callee function is called from caller functions at a plurality of locations, the callee function can be readily shared to reduce the area of a circuit resulting from the behavioral synthesis.

Second Embodiment

Figure 3:
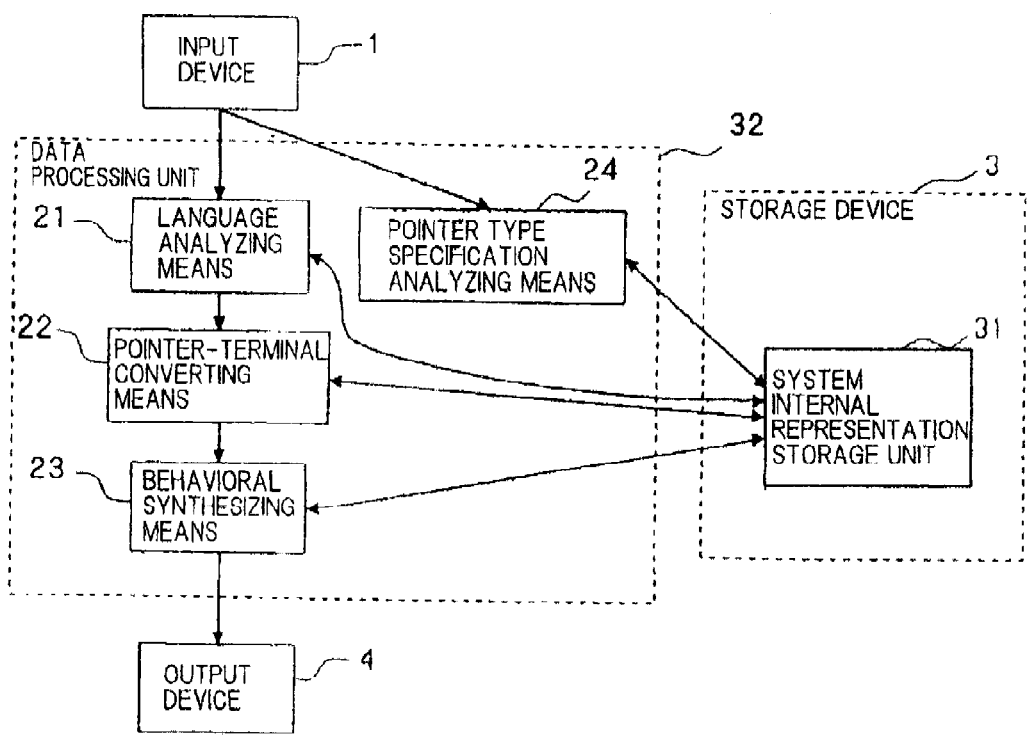
FIG. 3 is a block diagram illustrating the configuration of a behavioral synthesis system according to a second embodiment of the present invention.

Next, a behavioral synthesis system according to a second embodiment of the present invention will be described with reference to the drawings. As illustrated in FIG. 3, the behavioral synthesis system according to the second embodiment of the present invention comprises data processing unit (central processing unit, processor, or computer) 32 which operates under program control, input device 1, storage device 3, and output device 4. In FIG. 3, components identical to those in FIG. 1 are designated the same reference numerals, and a description thereon is omitted.

Data processing unit 32 comprises language analyzing means 21, pointer-terminal converting means 22, behavioral synthesizing means 23, and pointer type specification analyzing means 24.

Data processing unit 32 in this embodiment comprises pointer type specification analyzing means 24 added to data processing unit 2 in the behavioral synthesis system according to the first embodiment illustrated in FIG. 1.

Pointer type designation analyzing means 24 analyzes the designation of a specific circuit entity for a pointer (pointer type specification) applied from input device 1. Pointer type designation analyzing means 24 in this embodiment is similar to the other processing means in that it writes and reads a system internal representation into and from system internal representation storage unit 31 of storage device 3 as required.

Figure 4:
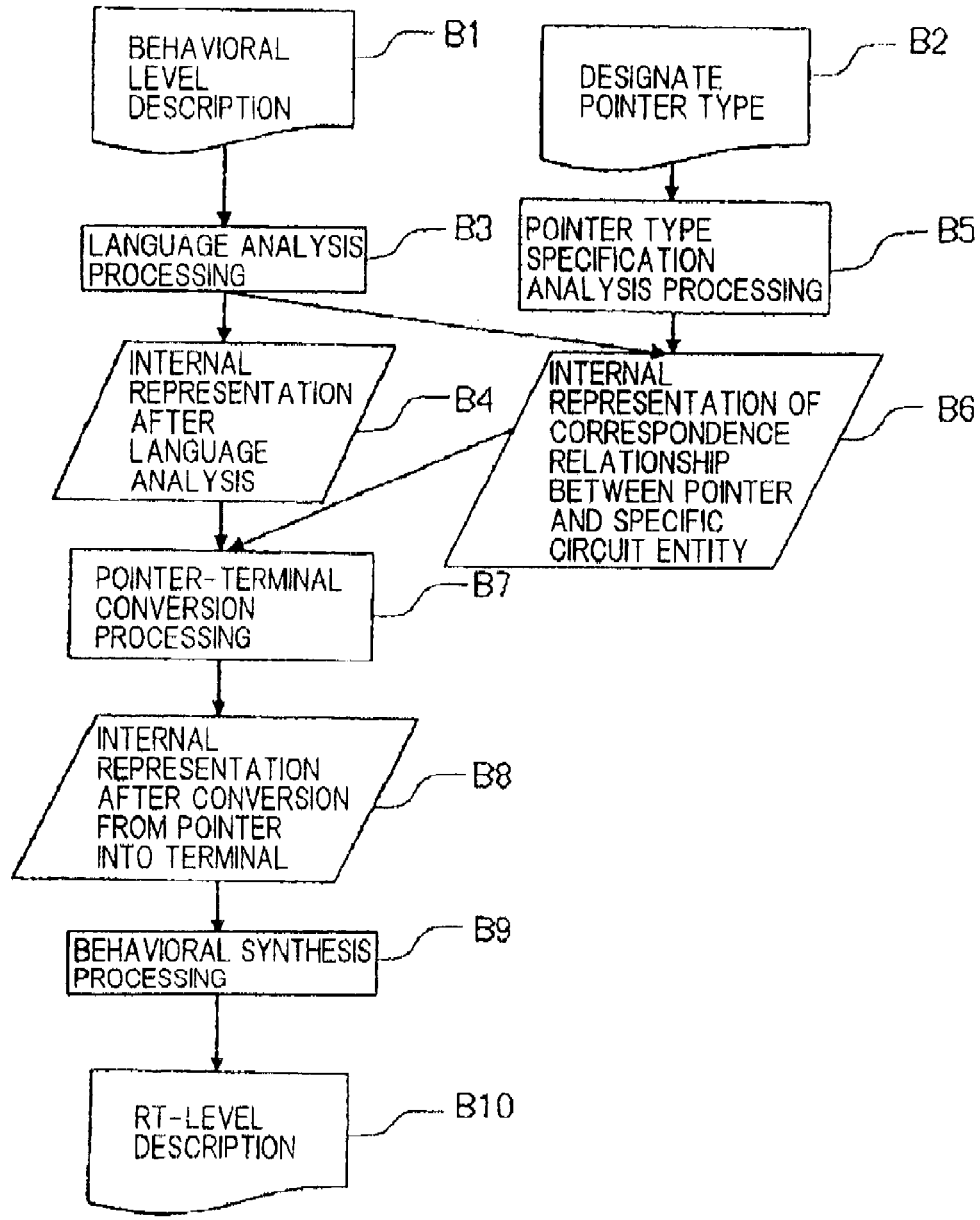
FIG. 4 is a system flow diagram illustrating the behavioral of the behavioral synthesis system according to the second embodiment of the present invention.

Next, the general behavioral of the behavioral synthesis system according to this embodiment will be described in detail with reference to the system flow chart of FIG. 4.

First, a user provides a behavioral-level description which describes highly abstract circuit specifications in C language or the like (step B1). Assume that this behavioral description includes a description for passing an argument to a callee function through a pointer. Also, the user provides a pointer type specification in the behavioral description (step B2), which defines to which specific circuit entity (register, memory, primary input terminal or the like) a pointer variable in each function argument should be mapped. The pointer type specification can be entered on a command line or through GUI, in addition to that provided in a file.

Next, language analyzing means 21 linguistically analyzes the behavioral-level description (step B3) for conversion into an internal representation for behavioral synthesis (step B4). In parallel with these steps, pointer type specification analyzing means 24 analyzes the pointer type specification at step B2 (step B5) for conversion into an internal representation indicative of a correspondence relationship between a pointer variable and a specific circuit entity when a pointer variable is converted into a specific circuit entity (step B6). Here, the designation of a method of converting a pointer into a specific circuit entity can be partially included in the behavioral-level description provided at step B1, and can be converted into an internal representation indicative of a correspondence relationship between a pointer variable and a specific circuit entity when a pointer variable is converted into a specific circuit entity (step B6) through language analysis processing (step B3), Since the internal representations at steps B5 and B6 are based on determining to which specific circuit entity a pointer in a function argument is mapped, pointer-terminal converting means 22 performs pointer-terminal conversion processing based on the conversion rule for each specific circuit entity (step B7) to convert the pointer into a set of a required terminal and a condition section (step B8).

Finally, behavioral synthesizing means 23 performs ordinary behavioral synthesis processing (step B9) to generate an RTL description (step B10).

Since the behavioral synthesis system of this embodiment employs a separate method for entering the pointer type specification which has been described in the behavioral description as a data type or as additional information in the behavioral synthesis system of the first embodiment described above, a method of mapping a pointer to a specific circuit entity can be separated from the behavioral description. Advantageously, the behavioral synthesis system can therefore manage information on the method of mapping a pointer to a specific circuit entity separately from the behavioral description, and can be supported by a GUI.

Third Embodiment

Figure 5:
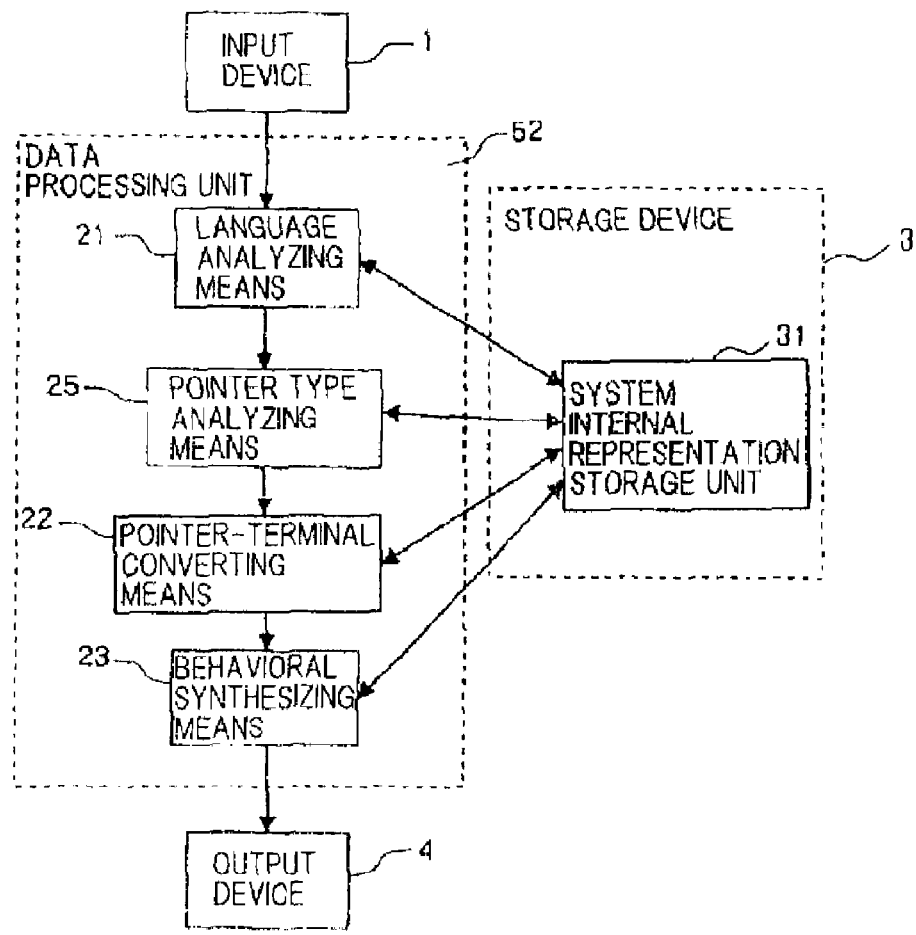
FIG. 5 is a block diagram illustrating the configuration of a behavioral synthesis system according to a third embodiment of the present invention.

Next, a behavioral synthesis system according to a third embodiment of the present invention will be described with reference to the drawings. As illustrated in FIG. 5, the behavioral synthesis system according to the third embodiment of the present invention comprises data processing unit (central processing unit, processor, or computer) 52 which operates under program control, input device 1, storage device 3, and output device 4.

Data processing unit 52 comprises language analyzing means 21, pointer-terminal converting means 22, behavioral synthesizing means 23, and pointer type analyzing means 25.

Data processing unit 52 in this embodiment comprises pointer type analyzing means 25 added to data processing unit 2 in the behavioral synthesis system according to the first embodiment illustrated in FIG. 1.

Pointer type analyzing means 25 determines a method of converting a pointer variable into a specific circuit entity based on the result of an analysis made by language analyzing means 21. Pointer type designation analyzing means 25 in this embodiment is similar to the other processing means in that it writes and reads a system internal representation into and from system internal representation storage unit 31 of storage device 3 as required.

Figure 6:
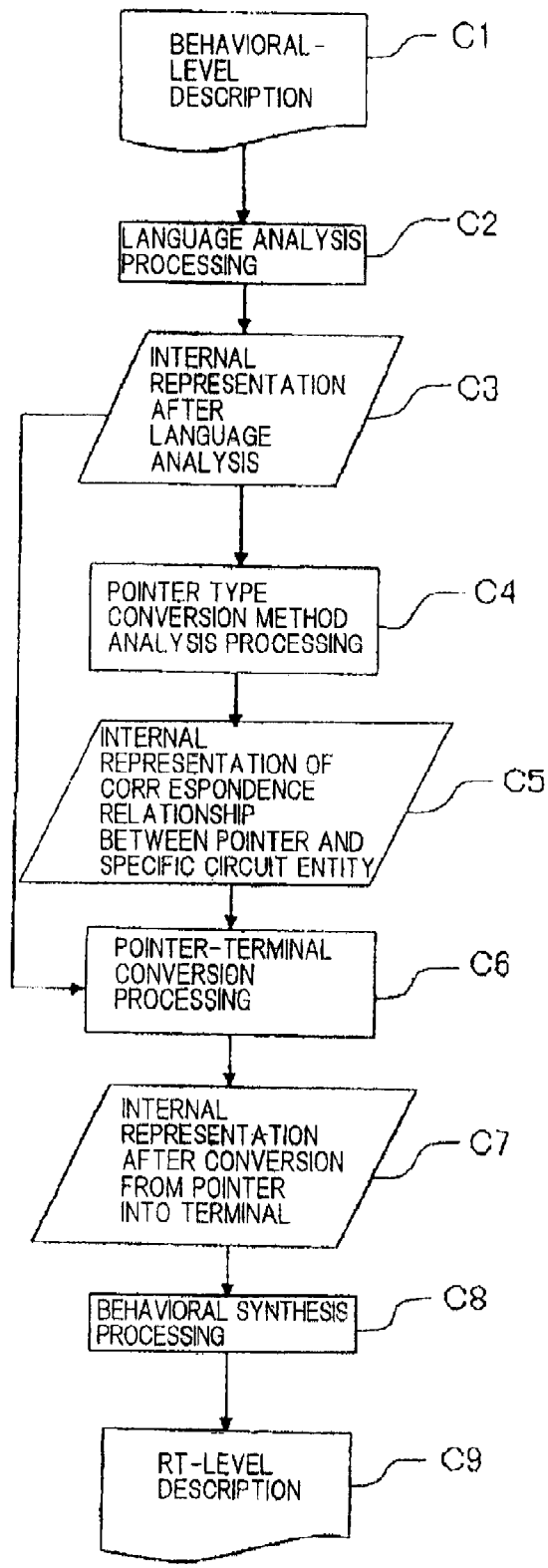
FIG. 6 is a flow diagram illustrating the behavioral of the behavioral synthesis system according to the third embodiment of the present invention.

Next, the general behavioral of the behavioral synthesis system according to this embodiment will be described in detail with reference to a system flow diagram of FIG. 6.

First, a user provides a behavioral-level description which describes highly abstract circuit specifications in C language or the like (step C1). Assume that this behavioral description includes a description for passing an argument to a callee function through a pointer.

Next, language analyzing means 21 linguistically analyzes the behavioral-level description provided at step C1 (step C2) for conversion into an internal representation for behavioral synthesis (step C3). Next, pointer type analyzing means 25 analyzes a pointer type conversion method (step C4) to determine a conversion rule for converting a pointer included in the behavioral-level description into a specific circuit from the method used in the behavioral-level description such as the size of an array, an access frequency and the like to generate an internal representation indicative of a correspondence relationship between a pointer variable and a specific circuit entity when a pointer variable is converted into a specific circuit entity based on a pointer type specification (step C5).

Since the internal representations at steps C3 and C5 is based on to determining to which specific circuit entity a pointer in a function argument is mapped, pointer-terminal converting means 22 performs pointer-terminal conversion processing based on a conversion rule for each specific circuit entity (step C6) to convert the pointer into a set of a required terminal and condition section (step C7).

Finally, behavioral synthesizing means 23 performs ordinary behavioral synthesis processing (step C8) to generate an RTL description (step C9).

According to the behavioral synthesis system of this embodiment, a pointer type can be determined by analyzing the method used in a behavioral-level description, whereas the user designates a pointer type in the behavioral synthesis systems of the first and second embodiments described above. Thus, the behavioral synthesis system of this embodiment can advantageously synthesize behavioral without requiring the user to designate a pointer type or be conscious of a specific circuit entity which would be mapped to a pointer.

Fourth Embodiment

Next, a behavioral synthesis system according to a fourth embodiment will be described in detail. Before generating an internal representation indicative of a correspondence relationship between a pointer variable and a specific circuit entity when a pointer variable is converted into the specific circuit entity, the behavioral synthesis systems of the first to third embodiments described above each determine a specific circuit entity for a pointer, and immediately convert the pointer into a terminal using that information after language analysis, whereas the fourth embodiment of the present invention converts a pointer into a set of a terminal and a condition section during or after an ordinary behavioral synthesis.

While the pointer is always eliminated before ordinary behavioral synthesis processing in the behavioral synthesis systems of the first to third embodiments described above, the behavioral synthesis system of the fourth embodiment is configured to eliminate the pointer during or after the ordinary behavioral synthesis, so that the pointer can be advantageously eliminated at an appropriate processing timing in a system which readily expands the behavioral synthesis processing itself.

Also, though not shown, the behavioral synthesis systems of the first to fourth embodiments each comprise a recording medium which has a program recorded thereon for executing the behavioral synthesizing method described above. This recording medium may be a magnetic disk, a semiconductor memory, or any other recording medium. The program is read from the recording medium into the behavioral synthesis system to control the behavioral of the behavioral synthesis system. Specifically, data processing unit 2, 32, 52 in the behavioral synthesis system instructs hardware resources of the behavioral synthesis system to perform specific behavioral under the control of the program, thereby implementing the foregoing processing.

Further, while the first to fourth embodiments have been described in connection with the configuration where storage device 3 having system internal representation storage unit 31 is disposed externally to data processing unit 2, 32, 52, the present invention is not limited to such a configuration, but a storage device may be contained in data processing unit 2, 32, 52 such that the internal representation is stored in this storage device.

EXAMPLES

Next, a description will be given of examples which employ the behavioral synthesis system according to the first embodiment of the present invention.

First Example

First, FIG. 7 shows a behavioral-level description which is applied to the system. The behavioral-level description in FIG. 7 is based on ANSI-C language, where keywords "input" and "output" are added to a primary input terminal and a primary output terminal, respectively. A Boolean type "bool" means a one-bit variable. FIG. 7 shows a relationship in which function main( ) is a parent function (caller function), and function func( ) is a child function (callee function), where the external terminals are applied to the parent function but are passed to function func( ) through pointers.

FIGS. 8 and 9 show main( ) and func( ), respectively, after a pointer-terminal conversion. In FIG. 8, func_i, func_o, func_start, and func_end are input/output terminals of function func( ), and an external terminal to be connected is determined for every condition of c1. In this behavioral-level description, func_start is set to one by the parent function when func( ) starts, and func_end is set to one by the child function when func( ) terminates. In FIG. 9, *i and *o, which are pointers in FIG. 7, are converted into terminals func_i, func_o, and func_start and func_end are generated to indicate the start and end of the behavioral of func( ). This conversion enables a behavioral synthesis through the flow of an ordinary behavioral synthesis tool.

Second Example

In FIG. 10, a register-type and a memory-type array are passed to function func( ). Here, this behavioral-level description means that the conversion rules of R and M are specified as a register and a memory, respectively, and that the numbers of their respective access ports are determined to be four and two. The behavioral-level description also indicates that argument *r of func( ) is synthesized with the number of access ports set to three. With the behavioral synthesis system of the first embodiment illustrated in FIGS. 1 and 2, main( ) and func( ) are converted as shown in FIGS. 11 and 12, respectively. In FIG. 11, the configuration of terminals in ports of the register and memory is defined as a struct Port type, and M and R are converted into representations of terminals in accordance with the numbers of their respective ports. Also, each of terminals generated from function func( ) is represented as a structure of m and r, and respective terminals are connected to the terminals of M and R. This conversion is determined only by a preliminary argument of func( ), and does not necessarily require the implementation of func( ). FIG. 12 shows a method of converting func( ), where m and r are converted into external terminals, respectively, and where substitution/reference to the array are converted to reference to read_data, and substitution into write_data.

Third Example

As shown in FIG. 13, when there are a plurality of types of specific circuit entities for pointers passed to function func( ), each pointer is converted to select a specific circuit entity to be connected, each time the function is called, as shown in FIG. 14, upon synthesis on main( ) side. Upon synthesis on func( ) side, on the other hand, pointers are converted to input/output terminals in conformity with the number of ports, as shown in FIG. 15, irrespective of specific circuit entities.

Fourth Example

When a specific circuit entity is an internal register within main( ) and is handled as an array in an ordinary behavioral synthesis flow as shown in FIG. 16, this is realized by converting pointers into a write into and a read from the array using a write_enable signal as shown in FIG. 17. On the other hand, on func( ) side, pointers are converted to input/output terminals irrespective of specific circuit entities, as shown in FIG. 18.

It can also be seen from the fact that "if(r.port [0].write_enable)[R[r.port[0].address]=r.port[0].write_data;] else [r.port [0].read_data=R[r.port[0].address];]" in FIG. 17 is generated from a function call "func(R,&a, &x);" in FIG. 16, that not only input/output terminals but also an "if-statement" will be generated as a condition section from a pointer.

What is claimed is:

1. A behavioral synthesis system for generating a circuit description at low abstractness from a behavioral-level description, said system comprising:
language analyzing means for analyzing a behavioral-level description entered thereinto for conversion into an internal representation for behavioral synthesis, and for generating an internal representation indicative of a correspondence relationship between a pointer variable and a specific circuit entity when the pointer variable is converted into a specific circuit entity, based on a pointer type specification within the behavioral-level description;
pointer-terminal converting means for converting a pointer variable in the internal representation generated by said language analyzing means into a set of a terminal and a condition section, based on a conversion rule; and behavioral synthesizing means for performing behavioral synthesis processing for the internal representation from which the pointer variable has been removed by said pointer-terminal converting means to generate and supply a circuit description at low abstractness;

wherein the behavioral synthesis system includes providing a design flow which allows a caller function to be completely independent of the implementation of a callee function upon synthesis of the caller function.

2. The behavioral synthesis system according to claim 1, further comprising pointer type specification analyzing means for analyzing a pointer type specification which is a designation of a pointer variable to a specific circuit entity in the entered behavioral-level description for conversation into an internal representation for behavioral synthesis.

3. The behavioral synthesis system according to claim 1, further comprising pointer type analyzing means for determining a method of converting a pointer variable into a specific circuit entity based on the result of the analysis by said language analyzing means.

4. The behavioral synthesis system according to claim 1, wherein said pointer-terminal converting means does not immediately convert a pointer variable into a set of a terminal and a condition section from the result of the analysis by said language analyzing means, but converts a pointer variable into a set of a terminal and a condition section during the behavioral synthesis processing in said behavioral synthesizing means.

5. A computer implemented behavioral synthesizing method for generating a circuit description at low abstractness from a behavioral-level description, said method comprising:

executing on a computer the steps of:

analyzing the behavioral-level description entered thereinto for conversion into an internal representation for behavioral synthesis, and generating an internal representation indicative of a correspondence relationship between a pointer variable and a specific circuit entity when the pointer variable is converted into a specific circuit entity, based on a pointer type description within the behavioral-level description;

converting a pointer variable in the internal representation into a set of a terminal and a condition section, based on a conversion rule; and performing behavioral synthesis processing for the internal representation from which the pointer variable has been removed to generate and supply a circuit description at low abstractness;

wherein the behavioral synthesizing method includes providing a design flow which allows a caller function to be completely independent of the implementation of a callee function upon synthesis of the caller function.

6. The behavioral synthesizing method according to claim 5, further comprising the step of analyzing a pointer type specification which is a designation of a pointer variable to a specific circuit entity in the entered behavioral-level description for conversion into an internal representation for behavioral synthesis.

7. The behavioral synthesizing method according to claim 5, further comprising the step of determining a method of converting a pointer variable into a specific circuit entity based on the result of the analysis.

8. The behavioral synthesizing method according to claim 5, wherein said step of converting a pointer variable into a set of a terminal and a condition section includes not immediately converting a pointer variable into a set of a terminal and a condition section from the result of the analysis on the behavioral-level description, but converting a pointer variable into a set of a terminal and a condition section during the behavioral synthesis processing.

9. A computer readable storage device having a program stored thereon for causing a computer to execute a behavioral synthesizing method for generating a circuit description at low abstractness from a behavioral-level description, said stored program comprising:

processing for analyzing the behavioral-level description entered thereinto for conversion into an internal representation for behavioral synthesis, and generating an internal representation indicative of a correspondence relationship between a pointer variable and a specific circuit entity when the pointer variable is converted into a specific circuit entity, based on a pointer type specification within the behavioral-level description;

processing for converting a pointer variable in the internal representation into a set of a terminal and a condition section, based on a conversion rule; and processing for performing behavioral synthesis processing for the internal representation from which the pointer variable has been removed to generate and supply a circuit description at low abstractness;

wherein the behavioral synthesis processing includes providing a design flow which allows a caller function to be completely independent of the implementation of a callee function upon synthesis of the caller function.

10. The computer readable storage device having a program stored thereon according to claim 9, wherein said stored program further comprises processing for analyzing a pointer type specification which is a designation of a pointer variable to a specific circuit entity in the entered behavioral-level description for conversion into an internal representation for behavioral synthesis.

11. The computer readable storage device having a program stored thereon according to claim 9, wherein said stored program further comprises processing for determining a method to convert a pointer variable into a specific circuit entity based on the result of the analysis.

12. The computer readable storage device having a program stored thereon according to claim 9, wherein said processing to convert a pointer variable into a set of a terminal and a condition section includes not immediately converting a pointer variable into a set of a terminal and a condition section from the result of the analysis on the behavioral-level description, but converting a pointer variable into a set of a terminal and a condition section during the behavioral synthesis processing.

* * * * *